United States Patent [19]

Elder

[11] Patent Number: 4,626,796

[45] Date of Patent: Dec. 2, 1986

[54] DIGITAL APPARATUS AND METHOD FOR PROGRAMMABLY PHASE SHIFTING AN AUDIO TONE

[75] Inventor: James H. Elder, Bedford, Va.

[73] Assignee: General Electric Company, Lynchburg, Va.

[21] Appl. No.: 707,375

[22] Filed: Mar. 1, 1985

[51] Int. Cl.$^4$ .................... H03K 5/135; H03L 7/08
[52] U.S. Cl. ................... 331/1 A; 307/262;
328/155; 331/16; 331/25; 332/19; 381/97
[58] Field of Search ................. 331/1 A, 16, 25;
332/19; 307/262; 328/155; 381/97

[56] References Cited

U.S. PATENT DOCUMENTS 4,021,757  5/1977  Nossen .................. 332/19
4,543,542  9/1985  Owen ................... 332/19

Primary Examiner—Siegfried H. Grimm
Attorney, Agent, or Firm—Nixon & Vanderhye

[57] ABSTRACT

Apparatus and method for programmably phase shifting an audio tone is disclosed for use in a cellular communications system. A digital phase lock loop (PLL) includes a programmable phase shift therewithin and an audio output, phase-shifted from an input audio tone, is extracted from the thus programmed PLL. The apparatus of the present invention is particularly designed to be realized using digital circuits capable of integration into a monolithic CMOS IC.

25 Claims, 3 Drawing Figures

DIGITAL APPARATUS AND METHOD FOR PROGRAMMABLY PHASE SHIFTING AN AUDIO TONE

BACKGROUND OF THE INVENTION

This invention relates to the field of phase shifting circuits for processing electrical signals. It has particular application to cellular communications systems and in particular to apparatus and method for programmably phase shifting a supervisory audio tone in such a system.

Cellular communications systems are growing in popularity and complexity. A cellular communications system comprises a plurality of cells each cell including at least one master station which is in communication with any number of mobile stations within the cell (typically via a fixed remotely controlled transceiver site within or adjacent the cell). A mobile station within the cell communicates to the master station which transfers the communication to conventional land telephone lines for routing the communication to the desired destination. As a mobile station moves from one cell to another, it must cease communication with the remote station of the cell from which it is departing and establish communication with a similar station in the cell which it is entering. In order to synchronize communications between the various stations and the mobile station, the fixed station emits a Supervisory Audio Tone (SAT). The mobile station must be capable of receiving the SAT and retransmitting this tone to the fixed station such that the retransmitted tone has a phase error of less than or equal to plus or minus 20 degrees.

Since each mobile station contains a transmitter-receiver which may impart a different value of phase error to any transmission, and since the mobile stations move with a speed which may affect the phase error of the retransmitted tone, each mobile station must be capable of adjusting the phase of the retransmitted tone in order to produce a retransmitted tone with a phase error of less than or equal to plus or minus 20 degrees with respect to the SAT.

Therefore, a need exists to provide circuitry in each mobile station which can adjustably phase shift the retransmitted audio tone. Moreover, to mass produce such a circuit each one must be capable of providing a different phase adjustment corresponding to the particular radio equipment in each mobile station.

Circuits are known which can phase shift the audio tone by analog means. Such circuitry is necessarily large and expensive to manufacture. This large circuitry takes up a great deal of room in the mobile station thus increasing the cost of the mobile station and making it more difficult to place the mobile station conveniently inside a vehicle.

Thus a need exists for an audio tone phase shift circuit which uses mostly digital circuits, could be manufactured at a reduced cost and in a miniaturized package. Such a digital circuit would have to be adjustable in order to provide the various phase shift adjustments required in different mobile stations. A programmable digital phase shift circuit capable of being integrated into integrated circuits would be most advantageous—and such a circuit is provided by this invention.

SUMMARY OF THE INVENTION

The present invention provides apparatus and method for programmably adjusting the phase shift of a relatively low frequency supervisory audio "tone" (SAT) (e.g. 5970 Hz, 6000 Hz or 6030 Hz in some current cellular radio systems).

The SAT is received and is phase locked to a reference tone by means of a phase lock loop (PLL). An oscillator is conventionally provided in the phase lock loop for generating a high frequency signal which is frequency divided to provide the reference tone. However, the phase of the reference signal may be adjusted by an amount corresponding to a programming digital signal input. Thus, the reference tone is capable of being phase adjusted with respect to the oscillator even while it is being phase locked to the SAT as part of the PLL. The oscillator of the phase lock loop thus outputs a high frequency signal which is adjustably "phase locked" to the lower frequency SAT (i.e. actually to a similar lower frequency sub-multiple of the oscillator output which is adjustably phase-shifted). This phase adjusted high frequency signal may be "extracted" and frequency divided and/or otherwise output to a sine wave generator which thus provides an output tone having a phase which is similarly adjusted with respect to the incoming SAT. In such a fashion, a transmitted output tone is generated having a phase error which may be adjusted (e.g. under control of a properly programmed control circuit) so as to be less than or equal to plus or minus 20 degrees with respect to the incoming SAT.

The operation and construction of circuit will be made more clear with respect to the following description of the preferred embodiment.

DETAILED DESCRIPTION OF THE PREFERRED EMBODIMENT

Figure 1:
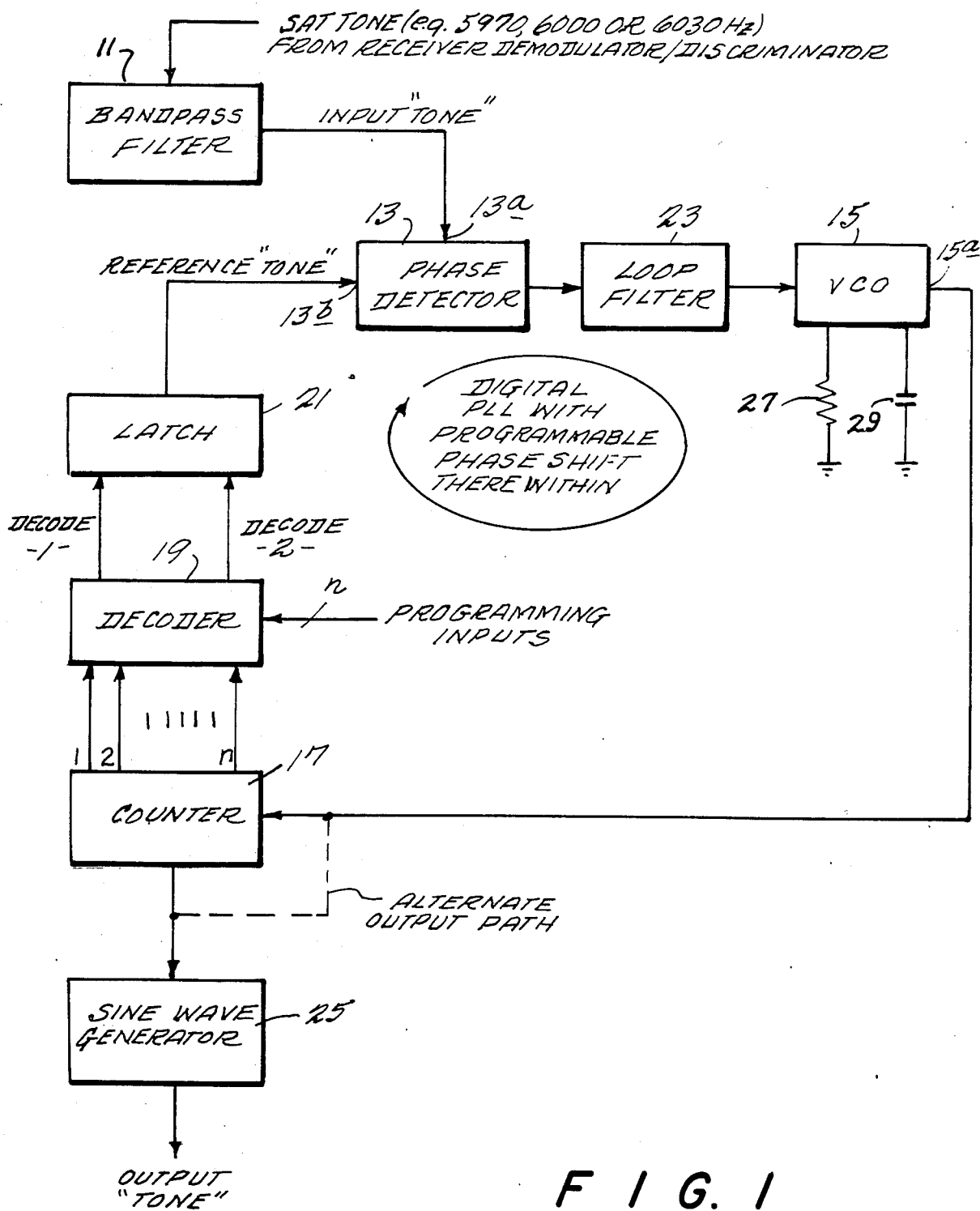
FIG. 1 is a schematic diagram of one embodiment of the present invention.

FIG. 1 depicts a schematic diagram of one embodiment of the present invention. The SAT is received at a conventional radio receiver discriminator (not shown). The discriminator (e.g. an FM discriminator) provides the received demodulated signal to a conventional bandpass filter 11 which may, for instance, comprise a switched capacitor filter. The use of a switched capacitor bandpass filter in such a circuit is advantageous in that it provides good input tone selectivity and it provides a square wave input "tone" with a given frequency and phase to a first input 13a of a conventional phase detector 13. Voltage controlled oscillator (VCO) 15 (or any other suitably controlled oscillator) is controlled by the output of phase detector 13 (e.g. through a conventional PLL loop filter 23) to generate an output at 15a having a frequency which is $2^n$ times the frequency of the input tone because the PLL includes a $2^n$ frequency divider (e.g. counter) 17.

Each state of the counter 17 (a state corresponds to a unique n-bit digital word) thus represents a $360/2^n$ degree phase shift of the PLL fundamental input frequency. The output of the counter may be taken from the least significant bit (LSB) and thus provides a square wave at the fundamental frequency (i.e. the LSB always goes low at state zero and high at state $2^{(n-1)}$). Thus, without decoder 19 and latch 21, a conventional digital PLL circuit is provided wherein the highest frequency of PLL operation is determined by the number of cyclic counter states (i.e. $2^n$).

However, decoder 19 is used to insert a controlled phase shift into the PLL loop. A digital programming signal may be used with a conventional $2^n$ state decoder circuit so as to decode and thus effectively select as a pseudo "starting" counter state any one of the $2^n$ possible states of the cyclically occurring n-bit words. For example, decoder 19 may have a decode "1" output and a decode "2" output which cause latch 21 to toggle at the desired fundamental frequency or rate—but which are controllably phased with respect to the VCO output and counter 17.

For example, when decoder 19 receives a digital programming signal (e.g. an n-bit word) indicating that the PLL should be adjusted to a given phase, this particular programming signal commanding (e.g. a decade "1" upon detecting counter state M) will be used to generate an accordingly phase adjusted output signal. The decode "1" output will go high when the programmed counter state M is detected among the plurality of n-bit words cyclically received from counter 17. Decode "2" is programmed to go high on detection of state $M+2^{(n-1)}$ modulo n (which should occur one-half a fundamental frequency output cycle later than when the decode "1" signal goes high). In actual implementation, the second decode may only require one additional gate since all of the counter bits except the MSB are identical for M and $M+2^{(n-1)}$ and the MSB is always inverted for state $M+2^{(n-1)}$ the desired time. For example, if M is chosen to equal decimal state 5, the programming signal input will be 000101 in binary. State $M+2^{(n-1)}$ will thus equal $M+32$ which equals 37 (in decimal) which, in turn, equals 100101 in binary.

These two decoded outputs are allowed to toggle latch 21 so as to produce a square wave which goes low at state M and high at $M+2^{(n-1)}$. This square wave may thus provide the reference "tone" which is input at 13b into phase detector 13.

Phase detector 13, in this embodiment, receives two square wave inputs and produces a difference signal which corresponds to the phase difference between these input tones. The difference signal is provided to a conventional low pass loop filter 23 which thus, provides a filtered (i.e., averaged over a short time) varying control signal input to control VCO 15 which generates a $2^n$ times higher frequency signal which is adjustably "phase locked" to the input SAT tone.

Since the output of VCO 15 has a controlled phase shift with respect to the incoming SAT, it may be used to generate a phase controlled transponded SAT (i.e. transmitted back to a fixed cellular station) which is, within specified limits, equal in phase to the incoming SAT. In the embodiment of FIG. 1, this desired output is obtained by use of a conventional sine wave generator 25 which is controlled by counter 17 which is, of course, already synchronized with the output of VCO 15. For example, some or all of the bits from each one of the plurality of n-bit words cyclically generated by counter 17 may be used by sine wave generator 25 to produce an output tone at the fundamental frequency having a phase which is locked and adjusted with respect to the received input SAT tone. Alternatively, other suitable conventional output waveform generator may be directly driven by the VCO output (as indicated by dashed lines) as will be understood by those in the art.

All of the components depicted in FIG. 1 are capable of integration into an integrated circuit, with the possible exception of loop filter 23 and the frequency determining components of VCO 15 (e.g. resistor 27 and capacitor 29). Thus, the circuit can, for the most part, be integrated into a CMOS IC with ease. Such an integrated circuit could be mass produced and each one, in use in a particular mobile transceiver, is then provided with a separate programming signal input (e.g. as supplied from a ROM specially programmed at the factory for that particular transceiver) as suitably determined from the requirements unique to that particular mobile station. If desired, such requirements can be continuously or repetitively automatically determined by suitable control circuits to maintain the programming signal at the proper value for existing conditions.

Figure 2:
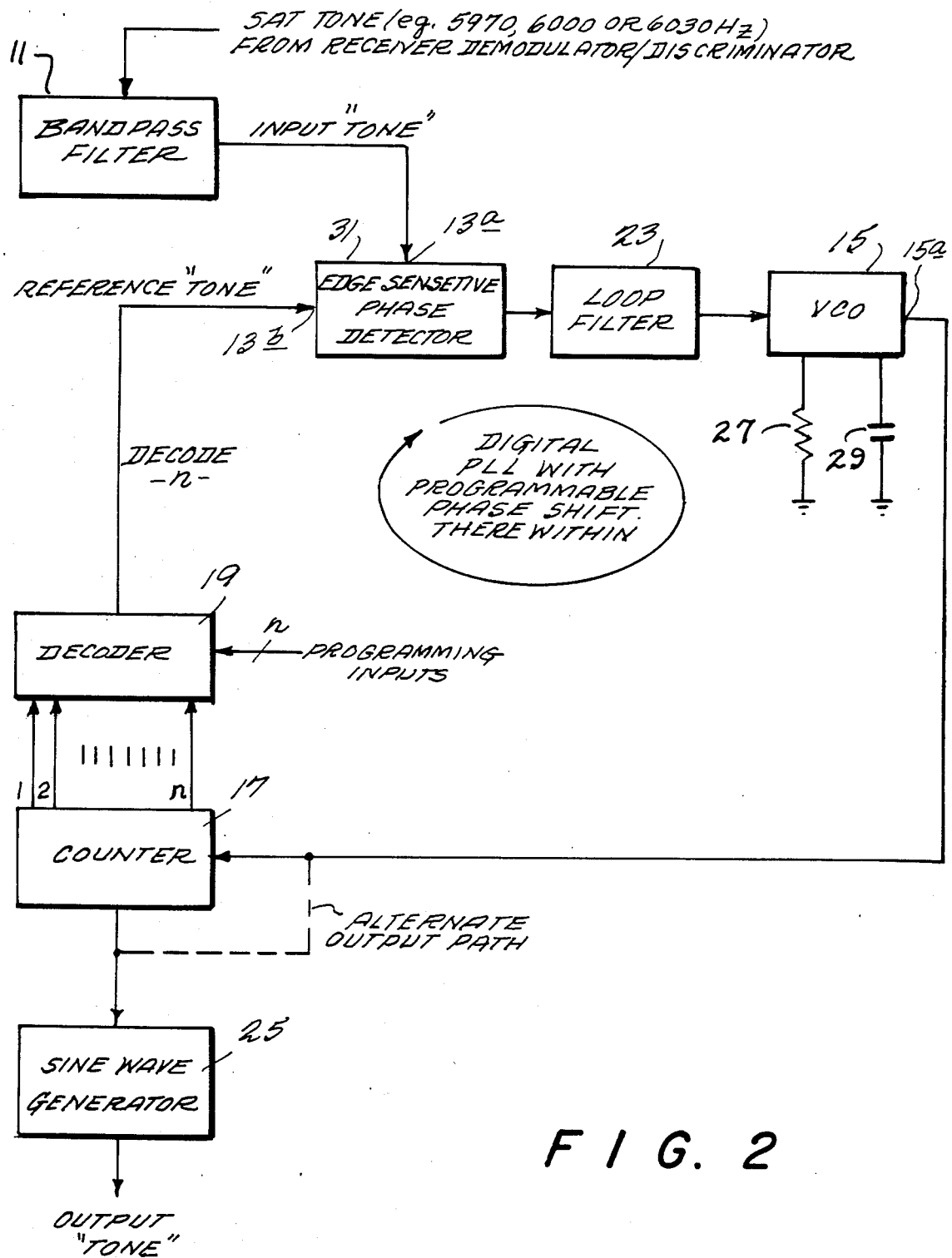
FIG. 2 is a schematic diagram of an alternative embodiment of the present invention.

FIG. 2 is a schematic diagram of one alternative embodiment of the present invention where like components are designated by like reference numerals with respect to the embodiment of FIG. 1.

The construction and method of operation of the FIG. 2 embodiment is essentially the same as the FIG. 1 embodiment except that instead of a latch 21 and a phase detector 13, a conventional edge-sensitive phase detector 31 is provided. Edge sensitive phase detector 31 detects the leading edge of one programmed output of decoder 19. This leading edge corresponds to programmed state M. Thus, edge sensitive phase detector 31 directly compares the square wave reference tone with the square wave input tone to provide the difference signal to loop filter 23.

Those skilled in the art will recognize that counter 17 may itself be controlled to skip some counting states (when so commanded) and to thus make its MSB output equivalent to the phase shifted output of decoder 19. There are no doubt other ways to introduce controlled phase shift into the PLL circuit so as to achieve the desired result.

Figure 3:
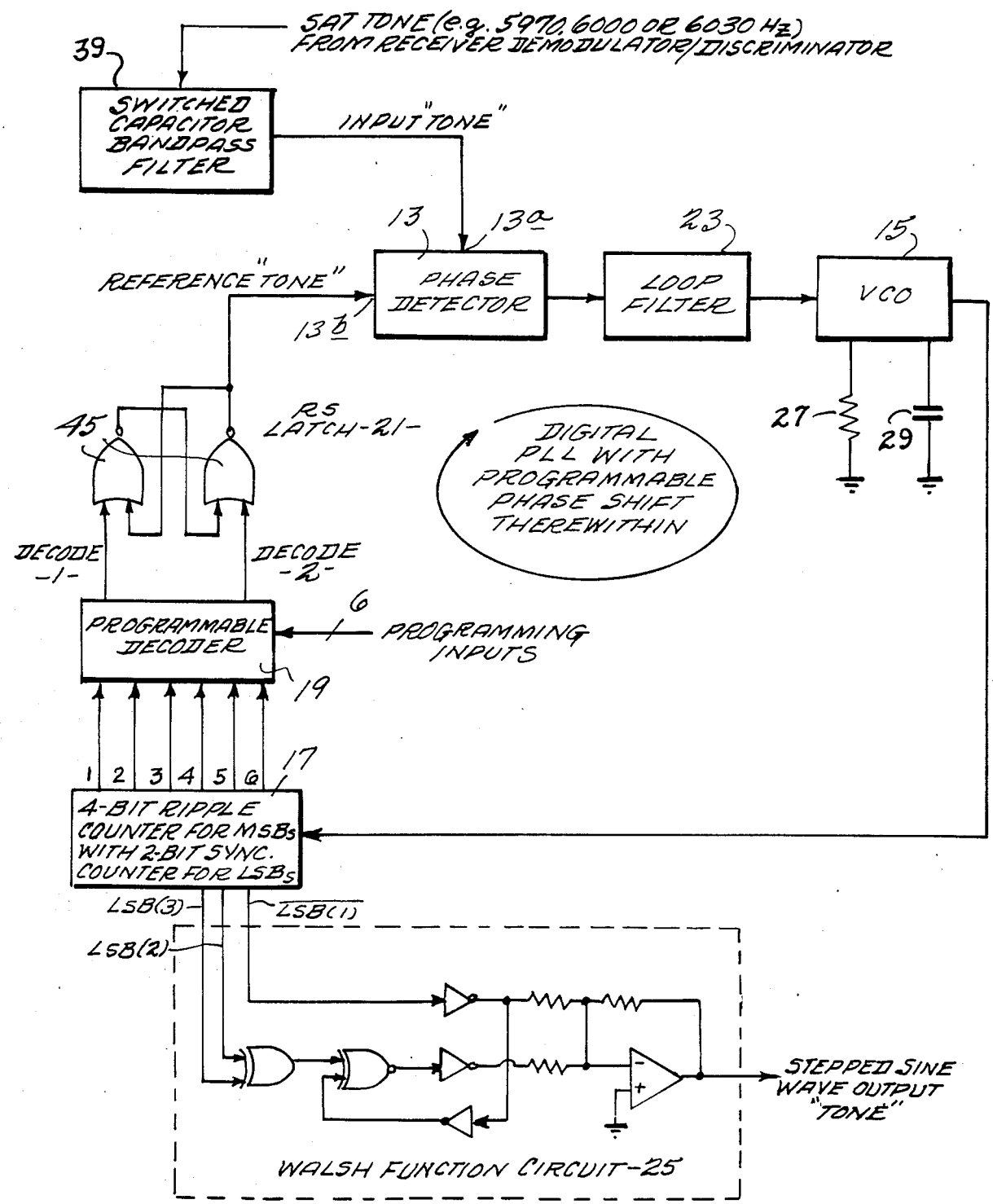
FIG. 3 is a schematic diagram of the presently most preferred embodiment of the present invention.

FIG. 3 is a schematic diagram of the presently most preferred embodiment of the invention. Again, like components are designated by like reference numerals with respect to FIG. 1.

The SAT is received from a discriminator (not shown) which feeds the received tone through a switched capacitor bandpass filter 39. In most cellular communication operations, the SAT is transmitted at a frequency of 5970 Hz, 6000 Hz, or 6030 Hz. Thus, switched capacitor bandpass filter 39 provides a square wave input tone to phase detector 13 having a corresponding one of these frequencies (i.e. approximately 6000 Hz). VCO 15 generates a $2^n$ times higher frequency (e.g. $2^n=64$) signal (e.g. having a frequency of approximately 384 kHz). This higher frequency signal is conventionally frequency divided by a factor of $2^6=64$ by counter 17 to produce the desired approximately 6000 Hz fundamental frequency. To avoid potential timing problems, the time least significant bit portions of counter 17 preferably comprise a conventional 2-bit synchronous counter while the remaining (e.g. four) more significant bit stages comprise a simple ripple counter.

A conventional programmable n-bit state decoder 19 is connected to the counter 17 and can be set to provide a decoded output upon occurrence of any desired one(s) of the $2^n$ states. The desired decoding state(s) programming is conventionally provided through a programming input by means of a suitable 6-bit programming signal. For example, when state M is chosen, the decode "1" output may be caused to go "high" when the 6-bit counter word corresponding to state M is detected. Decode "2" will go high when the 6-bit counter word corresponding to state $M+2^{(n-1)}$ modulo n is detected. Thus, complementary signals are provided on decode "1" and decode "2" which correspond to a phase adjusted signal (with respect to actual VCO output) operating at the fundamental incoming SAT frequency. The decode "1" and decode "2" signals are provided to an RS latch including NOR gates 45. As can be seen from FIG. 3, the output of the RS latch 21 will be a square wave reference tone having an adjusted phase and a frequency equal to the fundamental frequency. This reference tone is then fed to phase detector 13 where its phase is compared to the phase of the input tone. A difference signal corresponding to the phase difference is then provided through loop filter 23 to control VCO 15.

Conventional Walsh function circuit 25 may receive the three least significant bit outputs from the 6-bit counter 17.

While the invention has been described in connection with what is presently considered to be the most practical and preferred embodiments, it is understood that the invention is not to be limited to the disclosed embodiments but, on the contrary, is intended to cover various modifications and equivalent arrangements included within the spirit of the appended claims which scope is to be accorded the broadest interpretation so as to encompass all such modifications and equivalent structures.

What is claimed is:

1. A digital programmable electrical phase shift circuit capable of providing a predetermined frequency $f_1$ output signal having a programmable phase shift with respect to a supplied frequency $f_1$ input signal, said circuit comprising:

phase detector means having first and second inputs for comparing the relative phase of said input electrical signal of frequency $f_1$ on said first input with a reference electrical signal of frequency $f_1$ at said second input and for providing a control signal which is representative of the thus detected phase difference;

a controllable oscillator connected to said phase detector means for providing an output signal having a frequency of $Nf_1$ controlled only by the control signal provided by the phase detector means;

frequency dividing means connected to receive the output of said oscillator and to derive a frequency divided reference signal of frequency $f_1$ therefrom which reference signal is input to the second input of said phase detector means;

said frequency dividing means also producing a multi-bit digital signal recurring at frequency $f_1$ and including a digitally programmable circuit for effecting a controlled phase shift in said reference signal in accordance with a digital programming input by decoding said multi-bit digital signal so as to provide a digitally programmable electrical phase shift between said reference input signal and the output of said oscillator.

2. A digital programmable electrical phase shift circuit capable of providing a predetermined frequency $f_1$ output signal having a programmable phase shift with respect to a supplied frequency $f_1$ input signal, said circuit comprising:

a digital phase lock loop having an input for receiving said input signal of frequency $f_1$ and an output for providing said output signal of frequency $f_1$ phase-locked and phase-shifted with respect to the input signal;

said digital phase lock loop including a digitally programmable phase-shift circuit means therewithin which decodes a multi-bit digital signal that recurs at frequency $f_1$ so as to effect said phase-shifted output in accordance with an input digital programming signal.

3. A programmable audio phase shift apparatus capable of providing a single predetermined frequency $f_1$ output signal having a programmable phase shift with respect to a supplied single frequency $f_1$ input signal, said circuit comprising:

phase comparison means for receiving a first input signal having a phase $\phi_1$ and a frequency $f_1$ and for comparing its phase to that of a second signal of reference frequency $f_1$ input to a second input;

oscillator means controlled directly by the phase comparison means for generating a signal with a fixed frequency $f_2$ which is N times higher than said input signal frequency;

frequency dividing means connected to said oscillator means, for frequency dividing said higher frequency signal $f_2$ by a fixed divisor N and producing said reference signal input to the phase comparison means having a phase $\phi_2 2$ and a frequency $f_1$ and including a multi-bit digital signal cyclically recurring at frequency $f_1$;

said frequency dividing means including programming means connected to decode said multi-bit digital signal and having a programming input for receiving a programming signal and adjusting said phase $\phi_2$ by an amount $\Delta$ corresponding to said programming signal and for providing said adjusted reference signal to said second input of the phase comparison means; and output means connected to output a signal at said fundamental frequency $f_1$ but having a phase which is adjusted relative to phase $\phi_1$ by an amount corresponding to the value of said programming signal.

4. A programmable audio phase shift apparatus comprising:

phase comparison means for receiving a first input signal having a phase $\phi_1$ and a frequency $f_1$ and for comparing its phase to that of a second signal of similar frequency input to a second input;

oscillator means for generating a signal with a frequency $f_2$ which is higher than said input signal frequency;

frequency dividing means connected to said oscillator means, for frequency dividing said higher frequency signal $f_2$ and producing a signal having a phase $\phi_2$ and a frequency $f_1$;

programming means connected to said frequency dividing means and having a programming input for receiving a programming signal and adjusting said phase $\phi_2$ by an amount $\Delta$ corresponding to said programming signal and for providing said adjusted signal to said second input of the phase comparison means; and output means connected to output a signal at said fundamental frequency $f_1$ but having a phase which is adjusted relative to phase $\phi_1$ by an amount corresponding to the value of said programming signal;

said programming means including a digital signal decoder connected to said frequency divider so as to produce first and second outputs which, together, cyclically repeat at the $f_1$ frequency but at a relative phase determined by said programming signals; and latch means connected to said first and second decoder outputs and providing a phase-adjusted square wave reference signal at said $f_1$ frequency.

5. Apparatus according to claim 4 wherein said oscillator means includes a voltage controlled oscillator (VCO).

6. Apparatus according to claim 5 wherein said phase comparison means, said frequency dividing means, said programming means, said output means, said latch means, and said VCO means are digital circuits integrated into a common integrated circuit except, possibly, for some frequency-determining components of the VCO.

7. Apparatus according to claim 6 further comprising a switched capacitor bandpass filter connected to preprocess the first input signal before input to said phase comparison means.

8. Apparatus according to claim 6 wherein said output means includes means for generating a sine wave which is synchronous with a submultiple of the higher frequency $f_2$ output signal of the oscillator means.

9. Apparatus according to claim 8 wherein said sine wave generator means includes a Walsh function circuit.

10. Apparatus according to claim 3 wherein said phase comparison means includes:

edge sensitive phase detector means, connected to said programming means and to said first input signal, to detect respective edges of said input signal and of said phase adjusted signal and for providing an error signal which corresponds to the difference between the phases of said input signal and said phase adjusted signal; and loop filter means for receiving said error signal and providing a low-pass filtered signal to control said oscillator means.

11. Apparatus according to claim 10 wherein said oscillator means includes a voltage controlled oscillator (VCO).

12. Apparatus according to claim 11 wherein said frequency dividing means, said programming means, said edge sensitive phase detector means, said output means, and said VCO are digital circuits integrated into a common integrated circuit except, possibly, for some frequency-determining, components of the VCO.

13. A programmable audio phase shift apparatus comprising:

phase comparison means for receiving a first input signal having a phase $\phi_1$ and a frequency $f_1$ and for comparing its phase to that of a second signal of similar frequency input to a second input;

oscillator means for generating a signal with a frequency $f_2$ which is higher than said input signal frequency;

frequency dividing means connected to said oscillator means, for frequency dividing said higher frequency signal $f_2$ and producing a signal having a phase $\phi_2$ and a frequency $f_1$;

programmable means connected to said frequency dividing means and having a programming input for receiving a programming signal and adjusting said phase $\phi_2$ by an amount $\Delta$ corresponding to said programming signal and for providing said adjusted signal to said second input of the phase comparison means; and output means connected to output a signal at said fundamental frequency $f_1$ but having a phase which is adjusted relative to phase $\phi_1$ by an amount corresponding to the value of said programming signal;

said phase comparison means including edge sensitive phase detector means, connected to said programming means and to said first input signal, to detect respective edges of said input signal and of said phase adjusted signal and for providing an error signal which corresponds to the difference between the phases of said input signal and said phase adjusted signal;

loop filter means for receiving said error signal and providing a low-phase filtered signal to control said oscillator means;

said oscillator means including a voltage controlled oscillator (VCO);

said frequency dividing means, said programming means, said edge sensitive phase detector means, said output means, and said VCO being digital circuits integrated into a common integrated circuit except, possibly, for some frequency-determining components of the VCO; and a switched capacitor bandpass filter disposed to preprocess said first input signal and wherein:

said frequency dividing means includes an n-bit counter, said programming means includes a programmable decoder, and said output means includes means for generating a sine wave.

14. A programmable audio phase shift apparatus comprising:

phase comparison means for receiving a first input signal having a phase $\phi_1$ and a frequency $f_1$ and for comparing its phase to that of a second signal of similar frequency input to a second input;

oscillator means for generating a signal with a frequency $f_2$ which is higher than said input signal frequency;

frequency dividing means connected to said oscillator means, for frequency dividing said higher frequency signal $f_2$ and producing a signal having a phase $\phi_2$ and a frequency $f_1$;

programmable means connected to said frequency dividing means and having a programming input for receiving a programming signal and adjusting said phase $\phi_2$ by an amount $\Delta$ corresponding to said programming signal and for providing said adjusted signal to said second input of the phase comparison means; and output means connected to output a signal at said fundamental frequency $f_1$ but having a phase which is adjusted relative to phase $\phi_1$ by an amount corresponding to the value of said programming signal;

wherein said frequency-divided signal is derived from decoding a cyclically recurring (at frequency $f_1$) plurality of n-bit words, each successive unique n-bit word representing successive $360/2^n$ degrees of progressive phase shift at said fundamental frequency $f_1$, and wherein said programming means receives a digital n-bit state programming signal and decodes said plurality of n-bit words according to said state programming signal.

15. A programmable audio phase shift apparatus for receiving an input audio tone signal and providing an output audio tone having a phase that is controllably adjustable with reference to the phase of the input audio signal tone, said apparatus comprising:

bandpass filter means adapted for receiving said input signal and for producing a filtered input audio tone signal with a phase $\phi_1$ and a frequency $f_1$;

phase detector means for receiving said filtered input tone and a similar frequency reference audio tone having a frequency $f_1$, and for producing a difference signal which is proportional to a difference between phases of said filtered input tone and said reference tone signals;

oscillator means for receiving said difference signal and providing an oscillator output signal having a frequency $f_2$ controlled by said difference signal;

n-bit counter means for receiving said $f_2$ frequency oscillator output signal and providing a plurality of n-bit digital signals cyclically recurring at a fundamental frequency $f_1$, each said n-bit signal having a most significant bit (MSB) and least significant bit (LSB), each unique n-bit word representing $360/2^n$ degrees of phase shift at said fundamental frequency $f_1$;

decoder means, connected to receive said n-bit digital signals and having a state programming input, a decoder 1 output and a decoder 2 output, for receiving at least said MSB and a state programming signal corresponding to at least one of said n-bit signals, and for providing on said decode 1 output a detectable signal when a programmed state is detected in said n-bit counter means, and for providing on said decode 2 output a detectable signal occurring one half cycle (at frequency $f_1$) later than the signal on said decode 1 output;

latch means for receiving said detectable signals on said decode 1 and decode 2 outputs and providing said reference audio tone signal which is input into said phase detector means; and sine wave generator means, connected to said counter means, for receiving said at least one LSB and providing said output audio tone signal at frequency $f_1$ with a phase relative to the phase $\phi_1$ of the input audio tone signal which is adjusted by an amount corresponding to said programming signal.

16. Apparatus according to claim 15 wherein said decode 1 and decode 2 output signals collectively define a square wave having transitions corresponding to a counter state M and to counter state $M+2^{(n-1)}$ modulo n.

17. Apparatus according to claim 15 wherein said input tone and said reference tone are both square-shaped waves.

18. Apparatus according to claim 15 wherein said bandpass filter means includes a switched capacitor bandpass filter.

19. Apparatus according to claim 15 further including loop filter means, connected between said phase detector means and said oscillator means, for receiving said difference signal and providing a filtered difference signal to control said oscillator means.

20. A method of programmably and digitally phase shifting an audio signal so as to provide a predetermined frequency $f_1$ output signal having a programmable phase shift with respect to a supplied frequency $f_1$ input signal, said method comprising the steps of:

receiving an input signal having a phase $\phi_1$ and a frequency $f_1$;

generating a signal with a frequency $f_2$ which is N times higher than said input signal frequency $f_1$;

frequency dividing said higher $f_2$ frequency signal by a fixed divisor N and producing a second signal having a frequency $f_1$ signal as well as a multi-bit digital signal which recurs at frequency $f_1$;

adjusting the phase of said second signal by an amount corresponding to a digital programming signal by decoding said multi-bit digital signal;

phase locking said phase-adjusted second signal to said input signal; and outputting a signal at said frequency $f_1$ having a phase $\phi_2$ which is adjusted relative to $\phi_1$ by an amount corresponding to the digital value of said programming signal.

21. A method of programmably and digitally phase shifting an audio signal, comprising the steps of:

receiving an input signal having a phase $\phi_1$ and a frequency $f_1$;

generating a signal with a frequency $f_2$ which is higher than said input signal frequency $f_1$;

frequency dividing said higher $f_2$ frequency signal and producing a second signal having a frequency $f_1$;

adjusting the phase of said second signal by an amount corresponding to a digital programming signal;

phase locking said phase-adjusted second signal to said input signal; and outputting a signal at said frequency $f_1$ having a phase $\phi_2$ which is adjusted relative to $\phi_1$ by an amount corresponding to the digital value of said programming signal;

wherein said frequency dividing step includes the steps of:

receiving said higher $f_2$ frequency signal; and producing a plurality of n-bit cyclically recurring words at said frequency $f_1$, each unique n-bit word corresponding to $360/2^n$ degrees of phase shift.

22. A method according to claim 21 wherein said adjusting step includes the steps of:

receiving said plurality of n-bit words;

receiving a programming signal which commands one (M) of said n-bit words; and producing a phase adjusted signal at frequency $f_1$ according to said programmed signal M.

23. A method according to claim 22 wherein said producing step includes the step of producing a square wave phase-adjusted signal having transitions corresponding to an n-bit word value of M and to an n-bit word value of $M+2^{(n-1)}$ modulo n.

24. A method of programmably and digitally phase shifting an audio signal, comprising the steps of:

receiving an input signal having a phase $\phi_1$ and a frequency $f_1$;

generating a signal with a frequency $f_2$ which is higher than said input signal frequency $f_1$;

frequency dividing said higher $f_2$ frequency signal and producing a second signal having a frequency $f_1$;

adjusting the phase of said second signal by an amount corresponding to a digital programming signal;

phase locking said phase-adjusted second signal to said input signal; and outputting a signal at said frequency $f_1$ having a phase $\phi_2$ which is adjusted relative to $\phi_1$ by an amount corresponding to the digital value of said programming signal;

wherein said outputting step includes the steps of:
receiving said higher $f_2$ frequency signal; and
generating a sine wave at said fundamental $f_1$ frequency having a phase $\phi_2$ which is adjusted, compared to said input signal phase $\phi_1$, by an amount corresponding to said programming signal.

25. A method of programmably phase shifting an audio signal comprising the steps of:
receiving an input signal and producing a square wave input having a phase $\phi_1$ and a frequency $f_1$;
generating a higher frequency signal having a frequency $f_2$;
counting cycles of said higher frequency $f_2$ signal and producing a plurality of n-bit words recurring at the $f_1$ frequency, each said word having a most significant bit (MSB) and two least significant bits (LSB), each unique n-bit word representing $360/2^n$ degrees of phase shift at said fundamental frequency $f_1$;
decoding the occurrence times of predetermined ones of said plurality of n-bit words by receiving a digital programming signal which corresponds to one of said n-bit words M and providing a first decode signal at a time when said word M is detected and providing a second decode signal at a time when word $M+2^{(n-1)}$ modulo n is detected;
latching said first decode and second decode signals within a toggling device to provide a square wave reference tone having said fundamental frequency $f_1$ and a phase $\phi_2$ which is adjusted by an amount corresponding to said programming signal;
detecting a difference between phases of said reference tone and said input tone and providing a difference signal corresponding to said phase difference;
filtering said difference signal and providing said filtered difference signal to said generating step so that said higher frequency signal is at frequency $f_2 = 2^n f_1$; and
receiving at least said LSB and generating a sine wave audio output tone signal at said frequency $f_1$ having a phase which is adjusted by an amount corresponding to said programming signal.

* * * * *